(12) United States Patent
Ogino et al.

(10) Patent No.: US 6,888,230 B1
(45) Date of Patent: May 3, 2005

(54) SEMICONDUCTOR DEVICE, SEMICONDUCTOR WAFER, SEMICONDUCTOR MODULE, AND A METHOD OF MANUFACTURING SEMICONDUCTOR DEVICE

(75) Inventors: Masahiko Ogino, Hitachi (JP); Takumi Ueno, Mito (JP); Shuji Eguchi, Tokai-mura (JP); Akira Nagai, Hitachi (JP); Toshiya Satoh, Kanasagou-machi (JP); Toshiaki Ishii, Hitachi (JP); Hiroyoshi Kokaku, Hitachi (JP); Tadanori Segawa, Hitachi (JP); Nobutake Tsuyuno, Hitachi (JP); Asao Nishimura, Kokubunji (JP); Ichiro Anjoh, Koganei (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/429,297

(22) Filed: Oct. 28, 1999

(30) Foreign Application Priority Data

Oct. 28, 1998 (JP) ............................................ 10-307554

(51) Int. Cl.$^7$ .......................... H01L 29/40; H01L 21/48; H01L 21/46
(52) U.S. Cl. ........................ 257/669; 257/774; 257/782; 257/783; 438/127; 438/460
(58) Field of Search ................................ 257/782, 783, 257/774, 669, 635–36, 642–643, 913, 633, 773, 135, 668, 737–738, 638, 747, 409; 438/127, 460, 652, 666, 68, 113, 114; 561/728

(56) References Cited

U.S. PATENT DOCUMENTS

| | | | | |
|---|---|---|---|---|
| 4,571,819 A | * | 2/1986 | Rogers et al. | 438/430 |
| 5,148,265 A | | 9/1992 | Khandros et al. | |
| 5,394,014 A | * | 2/1995 | Ishikawa et al. | 257/790 |
| 5,744,758 A | * | 4/1998 | Takenouchi et al. | 174/255 |
| 5,844,304 A | * | 12/1998 | Kata et al. | 257/620 |
| 5,897,337 A | * | 4/1999 | Kata et al. | 438/114 |
| 5,949,142 A | * | 9/1999 | Otsuka | 257/737 |
| 6,004,867 A | * | 12/1999 | Kim et al. | 438/458 |
| 6,010,769 A | * | 1/2000 | Sasaoka et al. | 428/209 |
| 6,107,107 A | * | 8/2000 | Bruce et al. | 438/14 |
| 6,121,688 A | * | 9/2000 | Akagawa | 257/778 |
| 6,130,472 A | * | 10/2000 | Feger et al. | 257/643 |
| 6,171,887 B1 | * | 1/2001 | Yamaji | 438/106 |
| 6,252,298 B1 | * | 6/2001 | Lee et al. | 257/668 |
| 6,351,022 B1 | * | 2/2002 | Ball et al. | 257/618 |
| 6,353,182 B1 | * | 3/2002 | Chang et al. | 174/255 |
| 6,475,896 B1 | * | 11/2002 | Hashimoto | 438/613 |
| 2001/0035586 A1 | * | 11/2001 | Nakamura et al. | 257/774 |

FOREIGN PATENT DOCUMENTS

| | | | |
|---|---|---|---|
| EP | 0504669 | * | 5/1992 |
| JP | 3-68149 | * | 3/1991 |
| JP | 7-135189 | | 5/1995 |
| JP | 8-172159 | | 7/1996 |
| JP | 08-262487 | * | 10/1996 |
| JP | 09-232256 | * | 9/1997 |
| JP | 10-027827 | * | 1/1998 |
| JP | 11-54672 | * | 2/1999 |

* cited by examiner

*Primary Examiner*—David Zarneke
*Assistant Examiner*—James Mitchell
(74) *Attorney, Agent, or Firm*—Antonelli, Terry, Stout & Kraus, LLP

(57) ABSTRACT

Semiconductor devices, semiconductor wafers, and semiconductor modules are provided, wherein: the semiconductor device has a small warp; damage at the chip edge and cracks occurring in a dropping test are scarcely generated; and the semiconductor device is superior in mounting reliability and mass producibility. The semiconductor includes a semiconductor chip 64; a porous stress relaxing layer 3 provided on the plane, whereon circuits and electrodes are formed, of the semiconductor chip; a circuit layer 2 provided on the stress relaxing layer and connected to the electrodes; and external terminals 10 provided on the circuit layer; wherein an organic protecting film 7 is formed on the plane, opposite to the stress relaxing layer, of the semiconductor chip, and respective side planes of the stress relaxing layer, the semiconductor chip 6, and the protecting film 7 are exposed outside on the same plane.

20 Claims, 8 Drawing Sheets

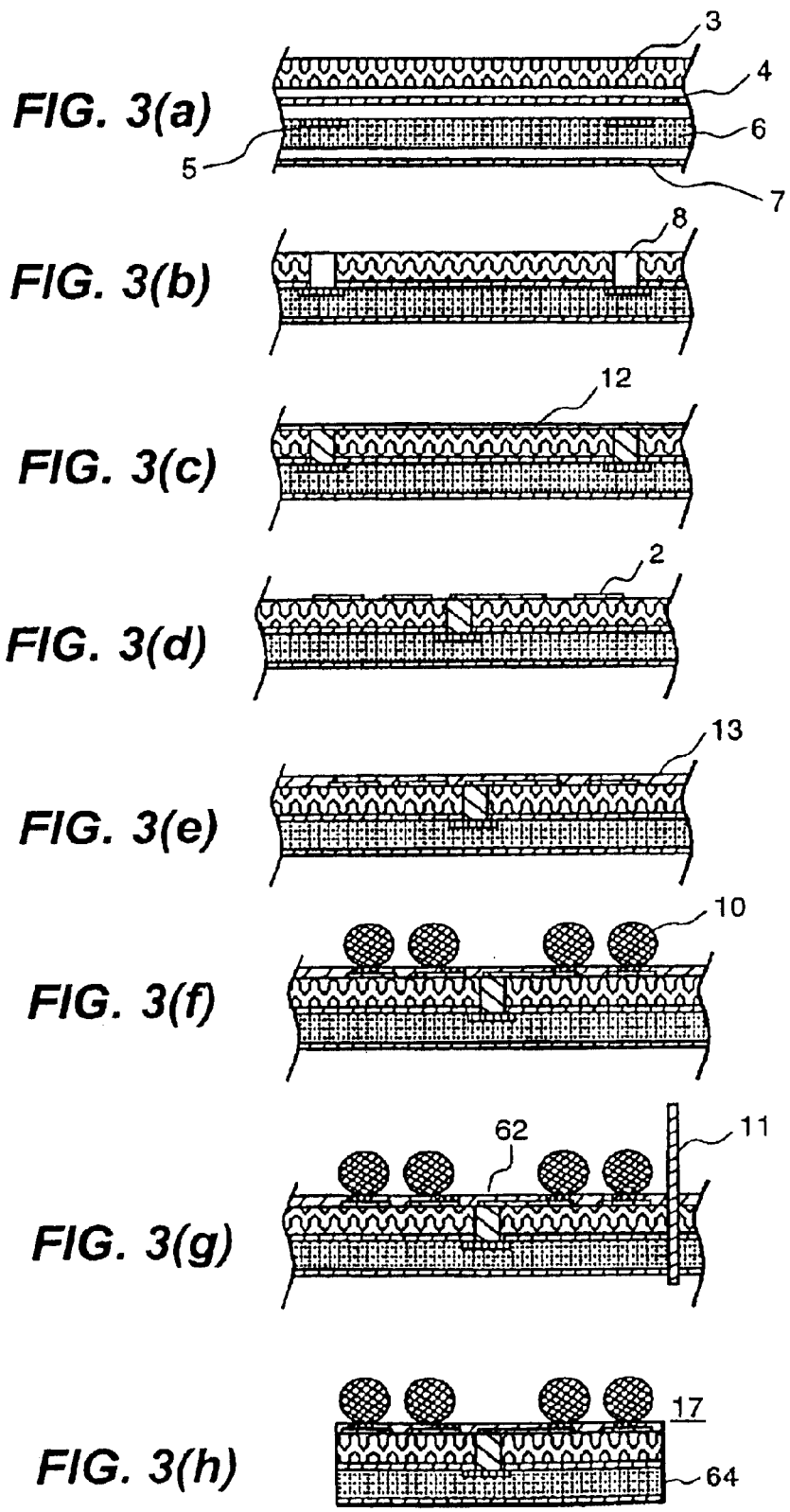

SEMICONDUCTOR DEVICE, SEMICONDUCTOR WAFER, SEMICONDUCTOR MODULE, AND A METHOD OF MANUFACTURING SEMICONDUCTOR DEVICE

BACKGROUND OF THE INVENTION

The present invention relates to a semiconductor device comprising a chip size package of the type used for a high density mounting module, a multichip module, and the like, a method of manufacturing the same, and to a semiconductor wafer used for manufacturing the semiconductor device.

Currently, in accordance with the current trend toward making electronic devices small, while retaining a high performance, semiconductor devices used therein are required to have a high integration, a high density, and to have a fast processing speed.

Corresponding to such a requirement, the methods of manufacture of semiconductor devices have been changed from the pin insertion type to a surface implementing method for increasing the implementing density; and, in order to accommodate an increasing number of pins, packages, such as a DIP (Dual Inline Package), a QFP (Quad Flat Package), a PGA (Pin Grid Array), and the like, have been developed.

However, implementation of the QFP is becoming difficult because of the increasing number of pins, since the connecting leads with the implementing substrate are concentrated at the periphery of the package, and the lead itself is thin and can be readily deformed. The PGA is disadvantageous in a high density implementation, because the increasing processing velocity is difficult to attain electrically, since terminals of the PGA for connecting with the implementing substrate are slender and are concentrated so as to be extremely close to each other, and surface implementation is impossible, since the PGA package is a pin insertion type.

Recently, in order to solve the above problems and to realize a semiconductor device having an increased processing velocity, a BGA (Ball Grid Array) package has been developed. The BGA package comprises a stress buffer layer between semiconductor chips and a substrate whereon circuits are formed, and bump electrodes, which are external terminals, on the implementing substrate side of the substrate whereon circuits are formed (U.S. Pat. No. 5,148,265). A package having a BGA structure is readily implemented on the surface, because deformation of the leads, such as occurs in a QFP does not occur, since the terminals for connection with the implementation substrate are provided in the form of ball-shaped solders, and the pitch between the terminals can be wide, since the terminals are dispersed all through the implementing plane. Furthermore, because the length of the bump electrode, i.e. the external terminal, is short in comparison with the PGA package, the inductance component is small, the signal velocity is fast, and it is possible to accommodate the requirement to increase the processing velocity.

On the other hand, JP-A-8-172,159 (1996) discloses a LOC (Lead On Chip) package, which comprises a cross sectional composition formed of sealing material/chip/protecting film/sealing material, as a chip provided with a protecting film. The protecting film increases the adhesion of the chip with the sealing material, and, at the same time, protects the chip from damage by a pick up pin.

JP-A-7-135189 (1995) discloses an invention relating to a wafer adhesion sheet for manufacturing semiconductor devices having a LOC structure. The wafer adhesion sheet is used as a protecting film until the chip is mounted in a package during the process for manufacturing the semiconductor.

Recently, in accordance with widespread used of portable information terminals, a decrease in size and a high density mounting of semiconductor devices are required. Therefore, a CSP (Chip Scale Package), the package size of which is almost the same as chip, has been developed. A CSP of various types has been disclosed in "Nikkei Micro Device" p38–p64, published by Nikkei BP Co. (February, 1998). A CSP is typically manufactured by the steps of: adhering semiconductor chips, which has been cut into respective pieces, onto a polyimide substrate or ceramic substrate, whereon a circuit layer is formed; electrically connecting the circuit layer with the semiconductor chip by a method such as wire bonding, single point bonding, gag bonding, bump bonding, and the like; sealing the connecting portion with a resin; and forming external terminals, such as solder bumps.

JP-A-9-232256 (1997) and JP-A-10-27827 (1998) disclose methods of mass production of a CSP. In accordance with these methods, the semiconductor device is manufactured by the steps of: forming bumps on the semiconductor wafer; connecting the circuit substrate electrically via the bumps; sealing the connecting portions with a resin; forming the external electrodes on the circuit substrate; and cutting the wafer into respective pieces. The "Nikkei Micro Device" p164–p167, published by Nikkei BP Co. (April, 1998), discloses another mass production method for the CSP. In accordance with the disclosed method, the semiconductor device is manufactured by the steps of: forming bumps on the semiconductor wafer by soldering; sealing portions other than the bumps with a resin; forming external electrodes at the bump portions; and cutting the wafer into respective pieces.

Among the CSP which are assembled by adhering the semiconductor chips cut in pieces to a polyimide substrate or a ceramic substrate, a CSP wherein a circuit layer is connected to the chip by wire bonding becomes larger than the chip size, naturally, because the bonding area of the circuit layer is located outside of the chip. In the case of a CSP connected by bump bonding, the substrate becomes larger than the chip in order to prevent resin from flowing down at the time of potting, because the interval between the chip and the substrate is sealed with resin after bonding. Accordingly, a problem occurred in that the package size of such a CSP became larger than the chip.

A CSP using chips cut in pieces experienced a problem in that it took a long time to manufacture the semiconductor device, because, after dicing the chips, each respective chip must be located correctly on the substrate, adhered thereon, connected electrically, and sealed.

A CSP using a resin substrate, such as a substrate made of polyimide and the like, as the circuit layer had a problem in that water, absorbed in the package at re-flowing when the package was provided onto the mounting substrate, was expanded and failures, such as bubble formation and peeling off, were generated, because the chip was adhered with an adhering agent.

A CSP, which was manufactured by the steps of: forming bumps on the semiconductor wafer; connecting the semiconductor wafer with the substrate; sealing the interval between the substrate and the semiconductor wafer with a resin; forming the external electrodes; and cutting the semiconductor wafer into respective pieces; had a problem of warping of the semiconductor wafer and the semiconductor device due to curing shrinkage, because the resin layer was formed on only one side of the wafer.

Additionally, except for the wire bonding type CSP, many of the CSP have an exposed plane, which is opposite to the plane whereon the circuits are formed on the chip. Therefore, there was a problem in that failures, such as cracks, were generated at the edge of the chip, and damage to the rear plane occurred due to the package falling down during transportation and handling thereof, such as when the package is picked up during a mounting operation.

SUMMARY OF THE INVENTION

In consideration of the above circumstances, one of the objects of the present invention is to provide semiconductor devices and a semiconductor wafer, wherein the package size is the same as the chip size, and failures in appearance, such as warp and damage are scarcely generated, and to provide a method of manufacturing the same.

Another object of the present invention is to provide to provide semiconductor devices and a semiconductor wafer, the package size of which is the same as the chip size, and which has a superior mounting reliability and mass producibility, and in which failures in appearance, such as warp and damage, are scarcely generated, and to provide a method of manufacturing the same.

The gist of the present invention to achieve the above objects is featured by a semiconductor device comprising a semiconductor chip, a stress relaxing layer provided on a plane of the semiconductor chip whereon the circuit and electrodes are formed, a circuit layer formed on the stress relaxing layer and connected to the electrodes, and external terminals provided on the circuit layer. The semiconductor device further comprises an organic protecting film provided on a plane opposite to the stress relaxing layer of the semiconductor chip.

Another feature of the present invention resides in a semiconductor device comprising a semiconductor chip, a porous stress relaxing layer provided on a plane of the semiconductor chip whereon the circuit and electrodes are formed, a circuit layer formed on the stress relaxing layer and connected to the electrodes, and external terminals provided on the circuit layer. The semiconductor chip further comprises an organic protecting film provided on a plane opposite to the stress relaxing layer of the semiconductor chip, and respective side planes of the stress relaxing layer, the semiconductor chip, and the organic protecting film are exposed outside on a same plane.

Another feature of the present invention resides in a semiconductor device comprising a semiconductor chip, a porous stress relaxing layer provided on a plane of the semiconductor chip whereon the circuit and electrodes are formed, a circuit layer formed on the stress relaxing layer and connected to the electrodes, an anisotropic conductor for electrical connection provided between the electrodes on the semiconductor chip and the circuit layer, external terminals provided at designated locations on the circuit layer in a grid array shape and an organic protecting film provided on a plane opposite to the plane of the semiconductor chip whereon the circuit and the electrodes are mounted; and, wherein, respective side planes of the stress relaxing layer, the semiconductor chip, and the organic protecting film are exposed outside on the same plane.

Another feature of the present invention resides in a semiconductor wafer comprising a plurality of chip areas, each of which comprises a circuit and electrodes; a stress relaxing layer provided on a plane whereon the circuit and electrodes in the chip area are formed; a circuit layer formed on the stress relaxing layer and connected to the electrodes; external terminals provided on the circuit layer; and an organic protecting film provided on a plane opposite to the stress relaxing layer in the chip area.

Another feature of the present invention resides in a method of manufacturing a semiconductor device comprising the steps of: forming a stress relaxing layer on a plane whereon a circuit and electrodes are formed in a respective chip area of a semiconductor wafer; forming an organic protecting film on a plane opposite whereon the electrodes are formed in the respective chip area; forming via-holes in the stress relaxing layer on the chip area; forming conductors in the via-holes; forming a circuit on the stress relaxing layer; forming external terminals on the circuit layer; and cutting the chip area, the substrate having the circuit, and the organic protecting film at the same plane so as to provide minimum units for operating the semiconductor device obtained by the cutting.

On the semiconductor wafer according to the present invention, a plurality of chip areas are arranged regularly; the chip area provides a minimum unit circuit for operating the semiconductor device, comprising semiconductor circuits such as logic circuit, a memory, a gate array, and the like, and the electrodes for input/output of electric signals to the outside the semiconductor wafer. The electrodes of the semiconductor device are arranged in a manner indicated in FIG. 11.

In accordance with the present invention, the substrate provided with a circuit layer is composed of a porous stress relaxing layer and the circuit layer, whereon the circuits are formed. The porous body is composed of a body comprising a structure of continuous bubbles having many fine pores inside, or a three dimensional network structure having a breathing property. The porous body is formed by any one of a track etching method, wherein the member is irradiated by neutrons and etched by a chemical agent; a drawing method, wherein a crystalline polymer is heated or plasticized with a plasticizer, and, subsequently, the crystalline polymer is drawn; a dissolution layer separating method, wherein a solvent having a different solubility depending on temperature is used; an extraction method, wherein a polymer is mixed with an inorganic salt, silica, and other materials uniformly, and after forming a film, only the inorganic salt and silica are extracted; a layer transferring method, wherein a polymer, a good solvent, and a poor solvent are mixed together, and after forming a film, only the good solvent is evaporated; and other methods. Additionally, a non-woven fabric, a sheet of which is formed by a paper machine using polymers polymerized in a solvent in a fibrous state, is included. The term breathing property refers to a phenomenon in which a gas, such as steam, air, and other gas, passes through the porous body via fine pores existing inside the porous body.

In accordance with the present invention, the linear expansion coefficient of the protecting film is preferably close to the linear expansion coefficient of the adhesion layer for adhering the stress relaxing layer to the semiconductor chip. The warp of the semiconductor chip and the semiconductor wafer by thermal stress can be prevented by making the difference of the linear expansion coefficient of the organic protecting film from those of the stress relaxing layer and the adhesion layer small. The thickness of the protecting film is greater than the thickness of the passivation film, such as PIQ formed on the plane, whereon the circuits are formed, and thinner than the thickness of the chip. After back grinding the rear plane of the wafer, the protecting film can be formed by adhering a sheet of the protecting film to the back ground plane of the semiconductor wafer, or coating the plane with a varnish made of the protecting film material by a spin coating method. The protecting film is adhered tightly to the wafer. The protecting film is desirably colored with black for shielding light.

In accordance with the present invention, the porous relaxing layer can be made of polycarbonate, polyester, aromatic polyester, polytetrafluoroethylene, polyethylene, polypropylene, polyvinylidene fluoride, cellulose acetate, polysulfone, polyacrylonitrile, polyamide, aromatic polyamide polyimide, aromatic polyimide, and their compounds. A part of the relaxing layer may be formed of a photosensitive material. The relaxing layer is more porous than the protecting film.

The circuit layer can be formed with any of gold, copper, aluminum, and these conductors, the outer surface of which is plated with gold. This circuit layer can be the insulating substrate, whereon the circuits are formed with one of these conductors. The insulating substrate is desirably made of engineering plastics superior in heat resistance and mechanical characteristics, such as polyimide and the like.

The circuit layer is manufactured by forming the conductor layer directly on the relaxing layer by vapor deposition or plating and the like, and, subsequently, by forming the circuits by etching the conductor layer. Otherwise, the circuit layer can be formed by adhering the insulating substrate, whereon the circuit is formed with the conductor, onto the stress relaxing layer. The adhering agent is composed of any resin of epoxy, maleimide, phenol, cyanate, polyamide, polyimide, polyamide-imide, polyester, polyolefin, polyurethane, and the like, and a mixture of any of these resins with a rubber component, such as silicone rubber, nitrile-butadiene rubber, and the like. Additionally, any agent, which exerts an adhesion force by heating, drying, pressurizing, photo-irradiation, and other technique, can be used as the adhering agent. In addition to the above compounds, the adhering agent can be a sheet, which is formed by impregnating any of the above compounds into a core material, such as a porous body, glass cloth and the like. The substrate, whereon the circuits are formed, is adhered to the semiconductor wafer with the above adhering agent.

The circuit layer is formed by the steps of: forming the porous relaxing layer on the electrode side plane of the semiconductor wafer; and forming the conductor layer on the relaxing layer by a method such as adhesion, plating, vapor deposition, and other techniques. Sometimes, the circuit layer is formed by pattern-etching the conductor layer with a designated process.

The via-hole formed between the circuit layer and the semiconductor wafer is manufactured using a laser, such as a He—Ne laser, Ar laser, YAG laser, carbon dioxide gas laser, and the like. Additionally, in some cases, the portions of the relaxing layer corresponding to the electrodes and the circuit layer of the semiconductor wafer are formed with a photosensitive material, and the via-hole is formed by exposing, developing, and etching of the photosensitive material.

The conductor portion for electrically connecting the semiconductor wafer and the circuit layer is formed with a conductive resin made by mixing conductive fine powder, such as carbon, graphite powder, gold, silver, copper, nickel, copper plated with silver, glass plated with silver, and the like, into a resin group binder, such as an epoxy group resin, a silicone group resin, a polyimide group resin, and the like. Electrical conduction can be achieved by forming a plated film in the via hole with a metal such as copper using a plating method. Additionally, the conductive portion can be manufactured by forming a deposition film on the inner wall of the via-hole with metal such as gold, copper, and others by heating deposition or spattering deposition in a vacuum. Other than the above method, in some cases, the wafer is electrically connected with the circuit layer by arranging a material having an anisotropic conduction in a direction of the thickness between the semiconductor wafer and the terminals of the circuit layer. A material having anisotropic conduction is a material manufactured by forming through holes with 20–30 $\mu$m pitch in an insulation film, such as polyimide and the like, and filling the through holes with a conductive material, such as copper and the like. The material is conductive only when the electrode exists at the same position in the thickness direction, and is not conductive in the XY direction.

The external electrode to be formed on the substrate, whereon the circuit layer is formed, is a conductor electrically connecting the semiconductor device by melting with heating. Practically, any type of a soldering alloy containing tin, zinc, and lead, silver, copper, or gold, or these metals formed in a ball shape and coated with gold, can be used for connecting the semiconductor device by heating and melting, or contacting and vibrating without melting. Other than these materials, any one of molybdenum, nickel, copper, platinum, titanium, and others, or an alloy composed of at least two of these elements, or a double film structure formed by at least two of these elements, can be used as the terminal.

The mounting substrate used for the semiconductor module is composed of a conductive layer and an insulating layer. The insulating layer is composed of a resin, such as epoxy, maleimide, phenol, cyanate, polyamide, polyimide, polyamide-imide, polytetrafluoroethylene, and the like, a, copolymer of these resins, or a rubber component, such as silicone rubber, nitrile-butadiene rubber, and the like. In particular, one of the above resins to which a photosensitivity is added, which can be made by patterning using a process such as exposing and developing, is preferable. Furthermore, in addition to the above resin itself, the insulating layer can be formed by impregnating any of the above compounds into a core material, such as a porous body, a glass cloth and the like.

The conductive layer is composed of a metal, such as gold, copper, aluminum, and the like. In consideration of the electrical characteristics, the mounting substrate is desirably a substrate whereon a ground layer and a power supply layer are provided.

In accordance with the present invention, the CSP having a package size which is the same as the chip size can be provided. A porous stress relaxing layer is used. The porous body is cut simultaneously when the semiconductor wafer is cut. Its end plane is inevitably exposed at the side plane of the package. Therefore, absorbed moisture at reflowing in mounting is released outside passing through the porous body. Accordingly, failures such as peeling off by vapor pressure of water can be prevented, and a CSP having a high reliability can be provided. Because the wafer is cut altogether into pieces representing respective units after assembling by wafer level, a CSP having a preferable mass producibility can be provided. Furthermore, a CSP can be provided, wherein the warp generated by thermal stress is made small due to the protecting film formed on a rear plane of the semiconductor wafer, and appearance failures, such as cracks and damages of the semiconductor chip during handling of the package, such as during transportation and positioning, will be scarcely generated.

BRIEF DESCRIPTION OF THE DRAWINGS

FIGS. 3(a) to 3(h) are schematic cross sections indicating manufacturing steps of a semiconductor device representing another embodiment of the present invention;

DETAILED DESCRIPTION OF THE EMBODIMENTS

Hereinafter, embodiments of the present invention will be explained in detail with reference to the drawings.
(Embodiment 1)

Figure 1:
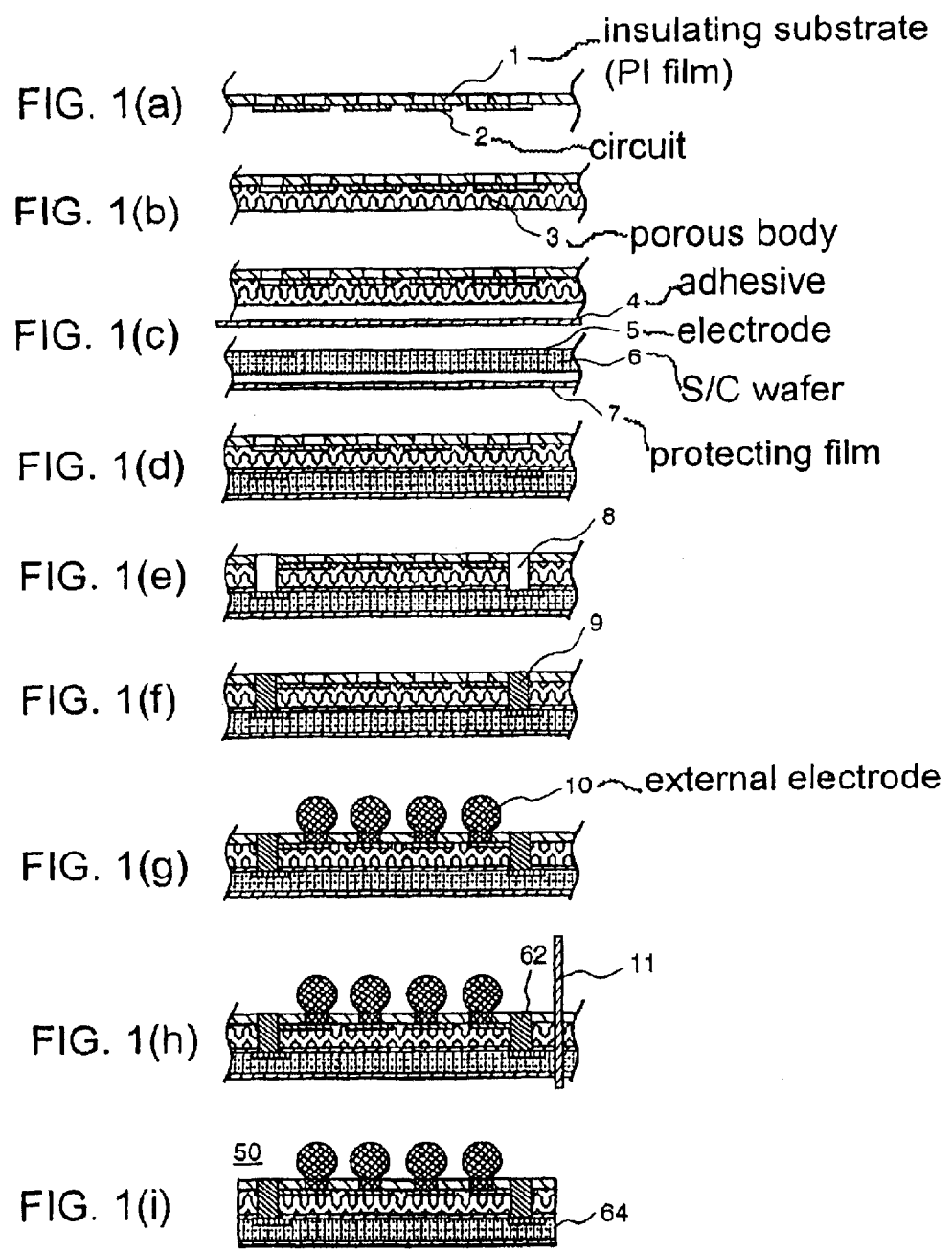
FIGS. 1(a) to 1(i) are schematic cross sections indicating manufacturing steps of a semiconductor device representing one embodiment of the present invention.

FIGS. 1(a) to 1(i) illustrate steps in the manufacture of a semiconductor device representing an embodiment of the present invention, and a semiconductor device obtained by the manufacturing steps is shown in FIG. 1(i).

In accordance with the manufacturing steps of FIGS. 1(a)–1(i), the semiconductor wafer and the semiconductor device of the present invention were prepared.

In the step of FIG. 1(a), a polyimide film (UB rex S: made by Ube Kosan Co.) 50 µm thick, whereon an epoxy group adhesive agent was applied, was used as the insulating substrate 1. Device holes were formed by punching in the insulating substrate 1. Electrolytic copper foil 18 µm thick was adhered to the polyimide film by heating and pressurizing with a roller at 150° C. After applying photosensitive resist (P-RS300S: made by Tokyo Ohka Co.) onto the electrolytic copper foil, it was baked at 90° C. for 30 minutes, and an etching mask was prepared by exposing and developing a pattern.

Then, the copper was etched with a ferric chloride aqueous solution (ferric chloride concentration is 40° Baume: specific gravity; approximately 1.38) at 40° C., and a copper circuit was prepared by peeling off the resist. The circuit 2 was prepared by plating the circuit portion with electrolytic gold. As explained above, a circuit 2 corresponding to respective chip areas on the semiconductor wafer was prepared.

In the step of FIG. 1(b), an adhesive varnish containing a non-volatile component 30% (bisphenol A type epoxy resin (EP1010: made by Yuka Shell Co.) was dissolved into a solvent, i.e. methylethylketone, a ortho-cresol novolak type phenol hardener (H-1: made by Meiwa Kasei Co.) was added, and a catalyst (triphenylphosphine: made by Wako Jyunyaku Co.) was mixed) was applied onto one of the surfaces of a porous body 3 composed of polyimide non-woven cloth having a three dimensional network structure of 150 µm, and the varnish was then dried. By adhering the circuit layer 2 prepared by the manufacturing step of FIG. 1(a) to the porous body 3 using an adhesive agent by heating and pressurizing at 120° C. for 5 seconds, the substrate comprising the circuit layer was prepared.

In the step of FIG. 1(c), the substrate, whereon the circuit layer was formed, the adhesive agent 4, the semiconductor wafer 6, and the wafer protecting film 7 were arranged as indicated. The substrate 1, whereon the circuit layer was formed, and the electrode 5 on the wafer were adjusted in position to match each other. As the semiconductor wafer 6, a semiconductor wafer 4 inches in diameter and 525 µm thick was used.

The adhesive agent 4 and the wafer protecting film 7 were prepared by impregnating an adhesive varnish containing a non-volatile component 35% (biphenyl type epoxy resin (YX-4000: made by Yuka Shell Co.) was dissolved into a solvent, i.e. methylethylketone, a ortho-cresol novolak type phenol hardener (H-1: made by Meiwa Kasei Co.) was added, and a micro-filler having a primary particle size of 12 nm (R974: made by Nippon Aero sol Co.) and a catalyst (triphenylphosphine: made by Wako Jyunyaku Co.) were mixed) into the polyimide non-woven cloth of 30 µm, and the varnish was dried.

In the step of FIG. 1(d), after back grinding the rear plane of the semiconductor wafer 6 to expose the silicon, the above members were adhered to the rear plane of the wafer by heating and pressurizing at 120° C. for 5 seconds. Furthermore, the members were cured by heating at 170° C. for 60 minutes.

In the step of FIG. 1(e), the via-holes 8 of 50 µm in diameter were formed by a YAG laser (made by ESI Co., wavelength: 355 nm, peak power: 4 kW, energy: 200 µj, pulse width: 50 ns).

In the step of FIG. 1(f), the conductor portion 9 was formed by injecting conductive paste (GP913: made by Asahi Kasei Co.) into the via-holes 8 using a printing method, and heating and curing the conductive paste at 170° C. for 40 minutes.

In the step of FIG. 1(g), the external electrode 10 was formed by applying flux at solder ball connecting portions of the substrate 1, whereon the circuit layer was formed, placing a eutectic solder ball (Pb 63: Sn 37) of 0.6 mm diameter thereon, and heating the solder ball by infrared re-flow heating at 240° C. for 5 seconds. Finally, marking was performed on the wafer protecting film 7 with an ink jet printer.

Figure 2:
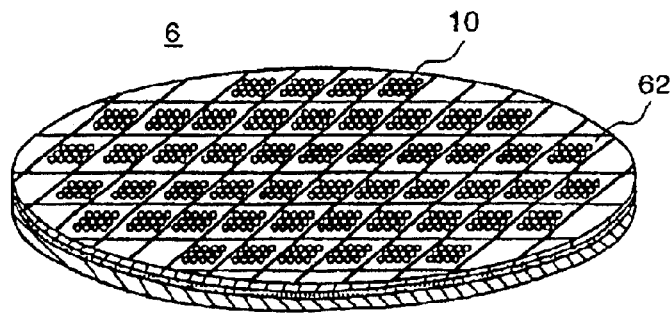
FIG. 2 is a perspective view of the semiconductor wafer based on the present invention as obtained by the manufacturing steps indicated in FIGS. 1(a) to 1(i)

In accordance with the above manufacturing steps, the semiconductor wafer 6, whereon plural chip areas were formed as indicated in FIG. 2, was prepared. The amount of warp of the semiconductor wafer 6 was evaluated using a film thickness measuring profilometer (dectac: made by ULVAC Co.).

In the step of FIG. 1(h), in order to cut the semiconductor wafer 6, dicing tape (UE-111AJ: made by Nitto Denko Co.)

was adhered onto the rear plane of the wafer protecting film 7. Then, a dicing saw 200 μm thick was attached to a dicer (DAD520: made by Disco Co.), and the substrate 1, whereon the circuit layer was formed, the adhesive agent 4, the semiconductor wafer 6, and the wafer protecting film 7 were cut simultaneously on the same plane, so that the semiconductor device 17, obtained by cutting the semiconductor wafer 6, would represent the smallest operable unit, i.e. the chip 64. After cutting, the dicing tape was peeled off from the wafer protecting film.

FIG. 1(i) shows the semiconductor device 17 of the present invention as prepared by the steps explained above. The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei Co.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter on a glass plate 5 mm thick. Furthermore the package area versus chip area was evaluated. The amount of warp of the package was also evaluated. The results are indicated in following Table 1.

(Embodiment 2)

FIGS. 3(a) to 3(h) show steps in the manufacture of a semiconductor device representing another embodiment of the present invention, and a semiconductor device obtained by the manufacturing steps as shown in FIG. 3(h).

In accordance with the manufacturing steps of FIGS. 3(a)–3(h), the semiconductor wafer 6 and the semiconductor device 17 of the present invention were prepared.

In the step of FIG. 3(a), a porous body 3 made of polytetrafluoroethylene having a three dimensional network structure of 150 μm, which was prepared by a drawing method, the adhesive agent 4, the semiconductor wafer 8, and the wafer protecting film 7 were arranged as indicated. A semiconductor wafer 8, which was 4 inches in diameter and 525 μm in thickness, was used. The adhesive agent 4 and the wafer protecting film 7 were prepared by impregnating the adhesive varnish containing non-volatile component 35% (biphenyl type epoxy resin (YX-4000: made by Yuka Shell Co.) was dissolved into a solvent, i.e. methylethylketone, an ortho-cresol novolak type phenol hardener (H-1: made by Meiwa Kasei Co.) was added, and a micro-filler having primary particle size of 12 nm (R974: made by Nippon Aero sol Co.) and a catalyst (triphenylphosphine: made by Wako Jyunyaku Co.) were mixed into the polytetrafluoroethylene sheet having a three dimensional structure of 30 μm, and the varnish was dried.

TABLE 1

| | Amount of warp of wafer (μm) | Amount of warp of package (μm) | Failure generation rate after 1000 cycles*[1] (Number of failures/number of tests) | Failure generation rate in reflow test*[2] (Number of failures/number of tests) | Failure generation rate in dropping test*[4] (Number of failures/number of tests) | Ratio of area (package area/chip area) |
|---|---|---|---|---|---|---|
| E-1 | ≦5 μm | ≦1 μm | 0/100 | 0/100 | 0/20 | 1 |
| E-2 | ≦5 μm | ≦1 μm | 0/100 | 0/100 | 0/20 | 1 |
| E-3 | ≦5 μm | ≦1 μm | 0/100 | 0/100 | 0/20 | 1 |
| E-4 | ≦5 μm | ≦1 μm | 0/100 | 0/100 | 0/20 | 1 |
| E-5 | ≦5 μm | ≦1 μm | 0/100 | 0/100 | 0/20 | 1 |
| E-6 | ≦5 μm | ≦1 μm | 0/100 | 0/100 | 0/20 | 1 |
| E-7 | ≦5 μm | ≦1 μm | 0/100 | 0/100 | 0/20 | 1 |
| E-8 | ≦5 μm | ≦1 μm | 0/100 | 0/100 | 0/20 | 1 |
| E-9 | ≦5 μm | ≦1 μm | 0/100 | 0/100 | 0/20 | 1 |
| E-10 | ≦5 μm | ≦1 μm | 0/100 | 0/100 | 0/20 | 1 |
| E-11 | ≦5 μm | ≦1 μm | 0/100 | 0/100 | 0/20 | 1 |
| C-1 | — | 5 μm | 85/100 | 90/100 | 0/20 | 1.44 |
| C-2 | — | ≦1 μm | 20/100*[3] | 0/100*[3] | 8/20 | 1.2 |
| C-3 | 20 μm | 5 μm | 20/100 | 50/100 | 12/20 | 1 |

*[1]Number of breakage failures after 1000 cycles in the range from −55° C. to −125° C.
*[2]Number of failures such as peeling, bubbling etc. during an infrared reflow test, after leaving the chip in an atmosphere of relative humidity of 85% at 85° C. for 166 hours.
*[3]Breakage failures between chip/circuit substrate.
*[4]Generation of breakage or cracks in a chip when dropping the chip from 1 meter high onto a glass substrate 5 cm thick was determined as a failure.

The semiconductor wafer 6 prepared in the present embodiment had a small warp equal to or less than 5 μm. The semiconductor device prepared in the present embodiment 17 had a small warp. The conductor portion can be made of a low coefficient of elasticity by connecting the chip 64 to the circuit layer 2 with a conductive resin, and the semiconductor device is made superior particularly in thermal cycle resistance, in addition to the effect of the stress relaxing layer. In accordance with the porous stress relaxing layer, reflow failure in mounting is not generated. The failure such as damage of the chip is not generated in the dropping test. The package size can be made the same as the size of the chip. In accordance with the process of the present embodiment, the package can be made merely by dicing, and so it is superior in mass producibility.

After back grinding the rear plane of the semiconductor wafer 6 so as to remove SiO$_2$ and to expose the silicon, the above members were adhered by heating and pressurizing at 120° C. for 5 seconds. Furthermore, the members were cured by heating at 170° C. for 60 minutes.

In the step of FIG. 3(b), via-holes 8 of 50 μm in diameter were formed by YAG laser (made by ESI Co., wavelength: 355 nm, peak power: 4 kW, energy: 200 μj, pulse width: 50 ns).

In the step of FIG. 3(c), a plated copper layer 12 was formed by immersing the semiconductor wafer, wherein the via-holes were formed in the porous body, backed by the wafer protecting film, into a plating solution at 70° C. to perform an electroless copper plating. Before plating, the semiconductor wafer was immersed into an acidic solution of a sensitizer (HS101B: made by Hitachi Kasei Co.) for treating a catalyst of catalytic electroless copper plating. The plating solution used had a composition of: copper sulfate heptahydrate; 0.04 mole/liter, ethylenediamine tetraacetic acid dehydrate; 0.1 mole/liter, glyoxylic acid; 0.03 mole/liter, sodium hydroxide; 0.1 mole/liter, 2, 2' pyridyl; 0.0002 mole/liter, and polyethylene glycol; 0.03 mole/liter.

In the step of FIG. 3(d), an etching mask was prepared by applying photosensitive resist (P-RS300S: made by Tokyo Ohka Co. onto the copper plated film, baking the resist at 90° C. for 30 minutes, and exposing and developing the pattern. Then, the copper was etched with ferric chloride aqueous solution (ferric chloride concentration is 40° Baume: specific gravity; approximately 1.38) at 40° C., and a copper circuit was prepared by peeling off the resist. The circuit 2 was prepared by plating the circuit portion with electrolytic gold.

In the step of FIG. 3(e), a solder resist film 13, whereon lands for external terminals were formed, was prepared using a photosensitive solder resist agent (PSR4000: made by Taiyo Ink Co.) on the circuit 2. The solder resist agent was applied onto the circuit side of the wafer by a spin coating method, and the agent was dried at 80° C. for 20 minutes, and then exposed and developed to form the lands. Further, it was cured at 150° C. for 60 minutes.

In the step of FIG. 3(f), an external electrode 10 was formed by applying flux at the land portions, placing a eutectic solder ball (Pb 63: Sn 37) 0.6 mm in diameter thereon, and heating the solder ball by infrared re-flow heating at 240° C. for 5 seconds. Finally, marking was performed on the wafer protecting film 7 formed, on the rear plane of the semiconductor wafer with an ink jet printer.

In accordance with the above manufacturing steps, the semiconductor wafer 6, whereon plural chip areas 62 were formed as indicated in FIG. 2, was prepared. The amount of warp of the semiconductor wafer 6 was evaluated using a film thickness measuring profilometer (dectac: made by ULVAC Co.).

In the step of FIG. 3(g), in order to cut the wafer, dicing tape 120 was adhered onto the wafer protecting film 7. A dicing saw 11, which was 200 μm thick, was attached to a dicer (DAD520: made by Disco Co.), and the substrate 1, whereon the circuit layer was formed, the adhesive agent 4, the semiconductor wafer 6, and the wafer protecting film 7 were cut simultaneously on the same plane so that the semiconductor device 17, obtained by cutting the semiconductor wafer 6, would represent the smallest operable unit, i.e. the chip 64. After cutting, the dicing tape was peeled off from the wafer protecting film.

FIG. 3(h) shows the semiconductor device 17 of the present invention as prepared by the steps explained above. The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei CO.) was used. Furthermore, a reflow test at 240° C. for 5 seconds was performed after absorbing moisture in an environment at 85° C. and a relative humidity of 85% for 48 hours. An appearance test to determine generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

The semiconductor wafer 6 represented by the present embodiment had a small warp equal to or less than 5 μm.

The semiconductor device prepared in the present embodiment 17 had a small warp, and the semiconductor device is superior particularly in thermal cycle resistance, because the stress relaxing layer is made of porous polytetrafluoroethylene having a low coefficient of elasticity. The semiconductor device does not generate a reflow failure during the mounting operation, because it is a low humidity absorber. Because the chip can be connected electrically with the circuit layer by forming the conductors at the via portions and the circuit layer simultaneously by plating, the semiconductor device of the present invention is superior in mass producibility.

A failure, such as damage to the chip, was not generated in the dropping test. The package size can be made the same as the size of the chip. In accordance with the process of the present embodiment, the package can be made merely by dicing the semiconductor wafer of the present embodiment, and the process is superior in mass producibility. In accordance with the process of the present embodiment, adjusting the locations of the circuit layer and the pads on the, chip becomes unnecessary, and the manufacturing process can be simplified.

(Embodiment 3)

Figure 4A:
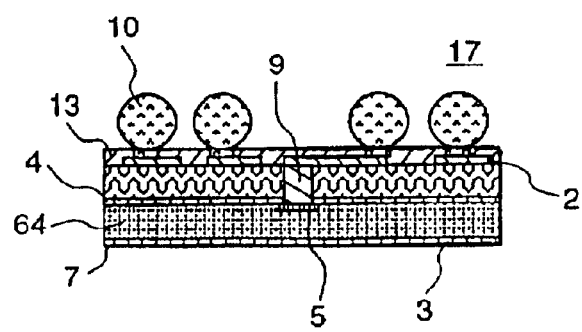
FIG. 4(a) is a schematic cross section and FIG. 4(b) is a perspective view showing an example of a semiconductor device representing another embodiment of the present invention.
Figure 4B:
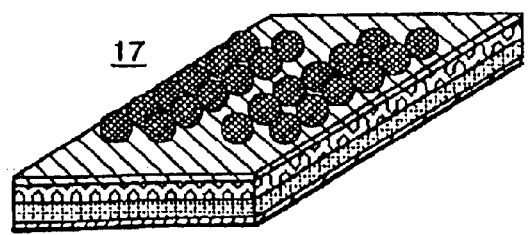

FIG. 4(a) and FIG. 4(b) show a cross sectional view and a perspective view, respectively, of a semiconductor device representing another embodiment of the present invention. The semiconductor device was obtained by the following manufacturing steps.

After forming the via-holes by the same process as the embodiment 2, copper film was formed on the inner wall of the via-holes and the surface of the porous body by a vacuum deposition method. The subsequent processes were the same as used in the previous embodiment to manufacture the semiconductor wafer 6 and the semiconductor device 17.

The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei Co.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

The semiconductor wafer 6 of the present embodiment had a small warp equal to or less than 5 μm. The semiconductor device 17 of the present embodiment had a small warp, and the semiconductor device is superior particularly in thermal cycle resistance, because the stress relaxing layer is made of porous polytetrafluoroethylene having a low coefficient of elasticity. The semiconductor device does not generate a reflow failure during the mounting operation, because it is a low humidity absorber. Because the conductive portions are formed by vapor deposition, a conductive layer having a high purity can be formed, and the electrical resistance is decreased. Therefore, the semiconductor can accommodate an increasing speed of operation. A failure, such as damage of the chip, was not generated in the dropping test. Furthermore, the package size can be made the same as the size of the chip, and the package can be made merely by dicing the semiconductor wafer of the present embodiment. Therefore, the process is superior in mass producibility.

(Embodiment 4)

Figure 5A:
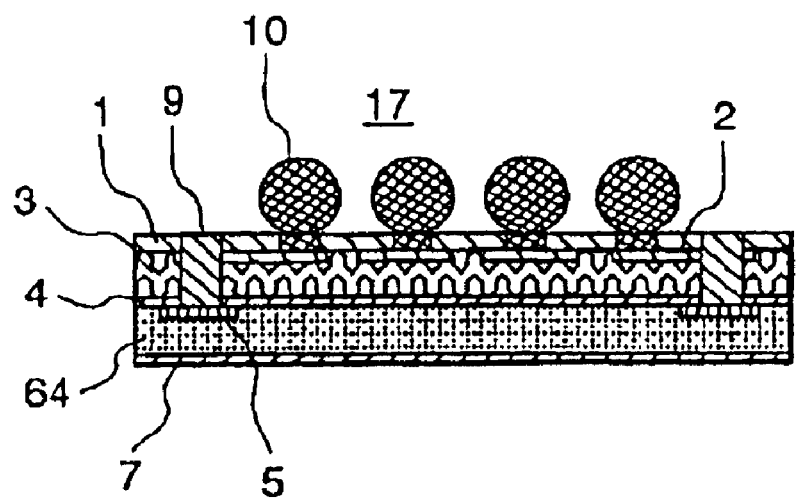
FIG. 5(a) is a schematic cross section and FIG. 5(b) is a perspective view showing an example of a semiconductor device in the other embodiment of the present invention.
Figure 5B:
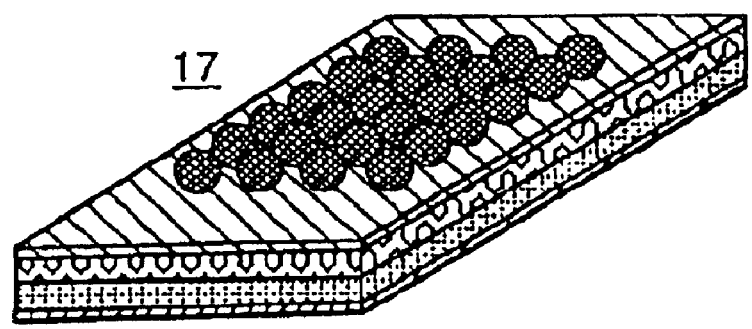
Figure 6A:
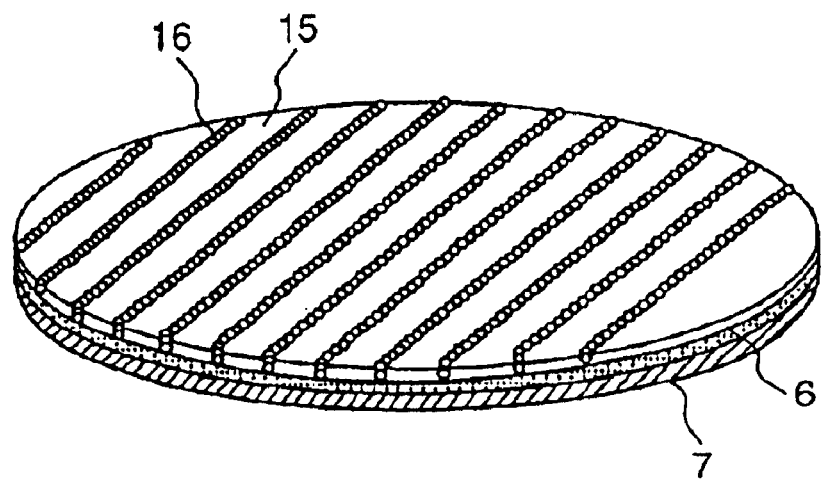
FIGS. 6(a) to 6(b) are perspective views illustrating a part of the manufacturing steps of a semiconductor device according to the present invention.
Figure 6B:
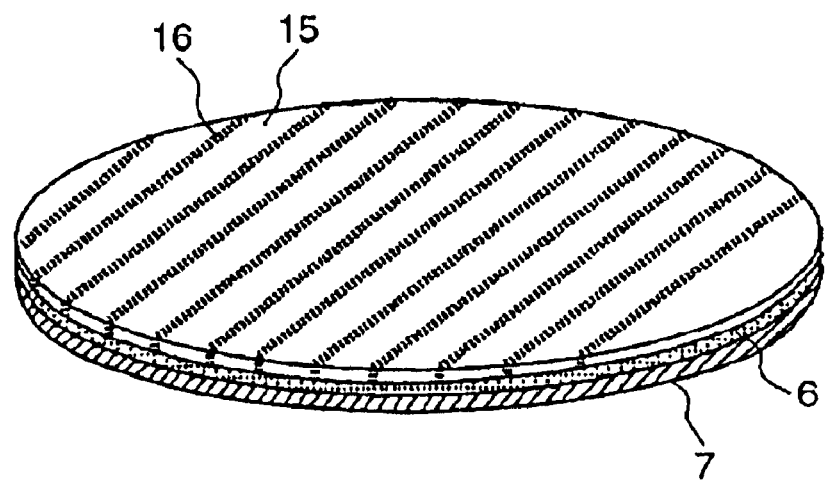

FIG. 5(a) and FIG. 5(b) show a cross sectional view and a perspective view, respectively of a semiconductor device representing another embodiment of the present invention. The semiconductor device 17 was obtained by the following manufacturing steps.

As the porous body 3, porous polyimide of 120 μm thick and having a three dimensional network structure, which was prepared by a layer transfer method, was used. As the adhesive agent and the wafer protecting film, thermoplastic polyimide (TP-D: made by Kaneka Co.) 30 μm thick was used, and the semiconductor wafer and the semiconductor device were prepared by the same method as the embodiment 1. However, heating and pressurization for adhering layers was performed at 260° C. for one second.

The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei CO.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

The semiconductor wafer 6 prepared in the present embodiment had a small warp equal to or less than 5 μm. The semiconductor device 17 of the present embodiment had a small warp. The semiconductor device is superior particularly in thermal cycle resistance, because the conductive portions could have a low coefficient of elasticity by connecting the chip to the circuit layer with a conductive resin, in addition to the effect of the stress relaxing layer. The semiconductor device does not generate a reflow failure during the mounting operation, because of the porous stress relaxing layer. A failure, such as damage to the chip, was not generated in the dropping test. Furthermore, the package size can be made the same as the size of the chip, and the package can be made merely by dicing the semiconductor wafer of the present embodiment. Therefore, the process is superior in mass producibility.

(Embodiment 5)

A semiconductor device 17, which was the same type as indicated in FIG. 4(a), was prepared by the following manufacturing steps.

As the porous body 3, porous polyimide 120 μm thick and having a three dimensional network structure, which was prepared by a layer transfer method, was used. As the adhesive agent and the wafer protecting film, a thermoplastic polyimide (TP-D: made by Kaneka Co.) 30 μm thick was used, and the semiconductor wafer 6 and the semiconductor device 17 were prepared by the same method as the embodiment 2.

The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei Co.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

The semiconductor wafer 6 of the present embodiment has a small warp equal to or less than 5 μm. The semiconductor device 17 of the present embodiment has a small warp and superior thermal cycle resistance, and does not generate a reflow failure during the mounting operation. Because the chip can be connected electrically with the circuit layer by forming the conductors at the via portions and the circuit layer simultaneously by plating, the semiconductor device of the present invention is superior in mass producibility.

A failure, such as damage to the chip, was not generated in the dropping test. The package size can be made the same as the size of chip. In accordance with the process of the present embodiment, the package can be made merely by dicing the semiconductor wafer of the present embodiment, and the process is superior in mass producibility.

(Embodiment 6)

A semiconductor device 17, which was the same type as indicated in FIG. 4(a), was prepared by the following manufacturing steps.

As the porous body 3, porous polyimide 120 μm thick and having a three dimensional network structure, which was prepared by a layer transfer method, was used. As the adhesive agent and the wafer protecting film, thermoplastic polyimide (TP-D: made by Kaneka Co.) 30 μm thick was used, and the semiconductor wafer 6 and the semiconductor device 17 were prepared by the same method as the embodiment 3.

The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei CO.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

The semiconductor wafer 6 of the present embodiment has a small warp equal to or less than 5 μm. The semiconductor device 17 of the present embodiment has a small warp and superior thermal cycle resistance, and does not generate a reflow failure during the mounting operation. Because the conductive portions are formed by vapor deposition, a conductive layer having a high purity can be formed, and the electrical resistance is decreased. Therefore, the semiconductor can accommodate an increasing speed of operation. A failure, such as damage to the chip, was not generated in the dropping test. Furthermore, the package size can be made the same as the size of the chip, and the package can be made merely by dicing the semiconductor wafer of the present embodiment. Therefore, the process is superior in mass producibility.

(Embodiment 7)

A semiconductor device 17, which was the same type as indicated in FIG. 5(a), was prepared by the following manufacturing steps.

The semiconductor wafer and the semiconductor device were prepared by the same method as the embodiment 1 using an alamide non-woven cloth (thermount: made by Du Pont Co.) 100 μm thick as the porous body 3 and a sheet made of rubber modified epoxy resin 30 μm thick as the adhesive agent and the wafer protecting film. The adhesive sheet was prepared by dissolving a varnish (biphenyl type epoxy resin (YX-4000: made by Yuka Shell Co.) was dissolved into a solvent, i.e. methylethylketone, an ortho-cresol novolak type phenol hardener (H-1: made by Meiwa Kasei Co.) was added, and a micro-filler having a primary particle size of 12 nm (R974: made by Nippon Aero sol Co.), nitrile butadiene rubber (XER-91: made by Nihon Gosei Rubber Co.), and a catalyst (triphenylphosphine: made by Wako Jyunyaku Co.) were mixed) onto a bed-film, and the varnish was dried.

The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei CO.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

The semiconductor wafer 6 of the present embodiment has a small warp equal to or less than 5 μm. The semiconductor device 17 of the present embodiment has a small warp. The semiconductor device is superior particularly in thermal cycle resistance, because the conductive portions could have a low coefficient of elasticity by connecting the chip to the circuit layer with a conductive resin, in addition to the effect of the stress relaxing layer. The semiconductor device does not generate a reflow failure during the mounting operation, because of the porous stress relaxing layer. A failure, such as damage to the chip, was not generated in the dropping test. Furthermore, the package size can be made the same as the size of the chip, and the package can be made merely by dicing the semiconductor wafer of the present embodiment. Therefore, the process is superior in mass producibility.

(Embodiment 8)

A semiconductor device 17, which was the same type as indicated in FIG. 4(a), was prepared by the following manufacturing steps.

The semiconductor wafer and the semiconductor device were prepared by the same method as the embodiment 2 using alamide non-woven cloth (thermount: made by Du Pont Co.) 100 μm thick as the porous body and a sheet made of rubber modified epoxy resin 30 μm thick as the adhesive agent and the, wafer protecting film. The adhesive sheet was prepared by applying a varnish (biphenyl type epoxy resin (YX-4000: made by Yuka Shell Co.) was dissolved into a solvent, i.e. methylethylketone, an ortho-cresol novolak type phenol hardener (H-1: made by Meiwa Kasei Co.) was added, and a micro-filler having a primary particle size of 12 nm (R974: made by Nippon Aero sol Co.), nitrile butadiene rubber (XER-91: made by Nihon Gosei Rubber Co.), and a catalyst (triphenylphosphine: made by Wako iyunyaku Co.) were mixed) onto a bed-film, and the varnish was dried.

The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei CO.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

The semiconductor wafer 6 of the present embodiment has a small warp equal to or less than 5 μm. The semiconductor device 17 of the present embodiment has a small warp, a superior thermal cycle resistance, and does not generate a reflow failure during the mounting operation. A failure, such as damage of the chip, was not generated in the dropping test. Furthermore, the package size can be made the same as the size of the chip, and the package can be made merely by dicing the semiconductor wafer of the present embodiment. Therefore, the process is superior in mass producibility.

(Embodiment 9)

A semiconductor device 17, which was the same type as indicated in FIG. 4(a), was prepared by the following manufacturing steps.

The semiconductor wafer and the semiconductor device were prepared by the same method as the embodiment 3 using alamide non-woven cloth (thermount: made by Du Pont Co.) 100 μm thick as the porous body and a sheet made of rubber modified epoxy resin 30 μm thick as the adhesive agent and the wafer protecting film. The adhesive sheet was prepared by applying a varnish (biphenyl type epoxy resin (YX-4000: made by Yuka Shell Co.) was dissolved into a solvent, i.e. methylethylketone, an ortho-cresol novolak type phenol hardener (H-1: made by Meiwa Kasei Co.) was added, and a micro-filler having a primary particle size of 12 nm (R974: made by Nippon Aero sol Co.), nitrile butadiene rubber (XER-91: made by Nihon Gosei Rubber Co.), and a catalyst (triphenylphosphine: made by Wako Jyunyaku Co.) were mixed) onto bed-film, and the varnish was dried.

The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei Co.) was used. Furthermore, a reflow test at 240° C. for 5 seconds was performed after absorbing moisture in an environment at 85° C. and a relative humidity of 85% for 48 hours. An appearance test such as generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

The semiconductor wafer 6 of the present embodiment has a small warp equal to or less than 5 μm. The semiconductor device 17 of the present embodiment has a small warp, a superior thermal cycle resistance, and does not generate a reflow failure during the mounting operation. Because the conductive portions are formed by vapor deposition, a conductive layer having a high purity can be formed, and the electrical resistance is decreased. Therefore, the semiconductor can accommodate an increasing speed of operation. A failure, such as damage to the chip, was not generated in the dropping test. Furthermore, the package size can be made the same as the size of the chip, and the package can be made merely by dicing the semiconductor wafer of the present embodiment. Therefore, the process is superior in mass producibility.

(Embodiment 10)

A semiconductor device 17, which was the same type as indicated in FIG. 4(a), was prepared by the following manufacturing steps.

The porous body portions 15 made of porous polytetrafluoroethylene were adhered to the portions of the semiconductor wafer 6 where the electrodes do not exist by heating and pressurizing at 120° C. for 5 seconds. Simultaneously, the wafer protecting film 7, which was as same as the protecting film in the embodiment 1, was adhered to the rear plane of the wafer. Subsequently, the semiconductor wafer was prepared by screen-printing the photosensitive material portions 14 using a photosensitive resin (BL-9500: made by Hitachi Kasei Co.) onto the electrodes 5 on the wafer, and drying at 80° C. for 10 minutes.

After forming the via-holes by exposing and developing the photosensitive portions, curing was performed at 180° C. for 2 hours. Subsequently, the semiconductor wafer 6 and the semiconductor device 17 were prepared by the same process as the embodiment 2.

The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei CO. was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

The semiconductor wafer 6 of the present embodiment has a small warp equal to or less than 5 μm. The semiconductor device 17 of the present embodiment has a small warp. The semiconductor device is superior particularly in thermal cycle resistance, because the stress relaxing layer is formed of porous polytetrafluoroethylene having a low coefficient of elasticity, and does not generate a reflow failure during the mounting operation, because of the low humidity absorbing rate. A failure, such as damage to the chip, was not generated in the dropping test. Furthermore, the package size can be made the same as the size of the chip, and the package can be made merely by dicing the semiconductor wafer of the present embodiment. Therefore, the process is superior in mass producibility.

(Embodiment 11)

A semiconductor device 17, which was the same type as indicated in FIG. 4(a), was prepared by the following manufacturing steps.

The semiconductor wafer was prepared by the steps of: arranging porous body portions made of porous polyimide having a three dimensional network structure 150 μm thick, whereon a thermoplastic polyimide adhesive layer for adhering to the semiconductor wafer was formed, on the portions of the semiconductor wafer 6 where electrodes on the wafer do not exist; arranging the anisotropic conductive portions 16 on the electrodes on the wafer using anisotropic conductive film (ASMAT: made by Nitto Denko CO.); and heating and pressurizing. Simultaneously, the wafer protecting film 7 made of thermoplastic polyimide was adhered to the rear plane of the wafer. Subsequently, the semiconductor wafer 6 and the semiconductor device 17 were prepared by the same process as the embodiment 2.

The semiconductor device 17 was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei Co.) was used. Furthermore, a reflow test at 240° C. for 5 seconds was performed after absorbing moisture in an environment at relative humidity 85% for 48 hours. An appearance test to detect generation of a chip crack and the like was performed after dropping the semiconductor device at a height of 1 meter onto a glass plate of 5 mm thick. Furthermore, the package area versus chip area was evaluated. The amount of warp of the package was also evaluated. The results are indicated in Table 1.

The semiconductor wafer 6 of the present embodiment has a small warp equal to or less than 5 μm. The semiconductor device 17 of the present embodiment has a small warp. The semiconductor device is superior particularly in thermal cycle resistance by a synergistic effect with the effect of the stress relaxing layer, because making the conductive portion have a low coefficient of elasticity becomes possible by forming the conductive portion between the chip and the circuit layer with an anisotropic conductive material. A reflow failure is not generated during the mounting operation, because of the porous stress relaxing layer. A failure, such as damage to the chip, was not generated in the dropping test. Furthermore, the package size can be made the same as the size of the chip, and the package can be made merely by dicing the semiconductor wafer of the present embodiment. Therefore, the process is superior in mass producibility.

(Embodiment 12)

Figure 7A:
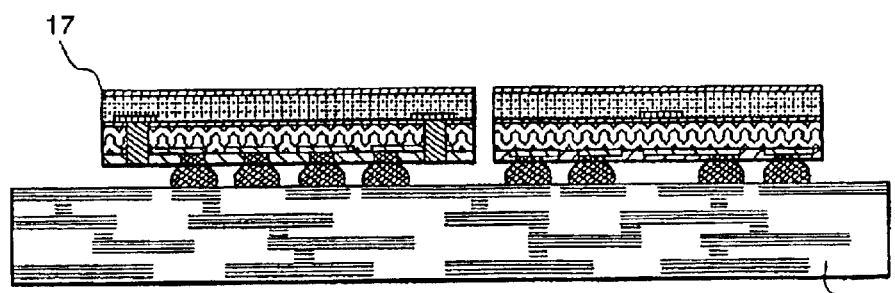
FIG. 7(a) is a schematic cross section and FIG. 7(b) is a perspective view showing an example of a semiconductor module based on the present invention.
Figure 7B:
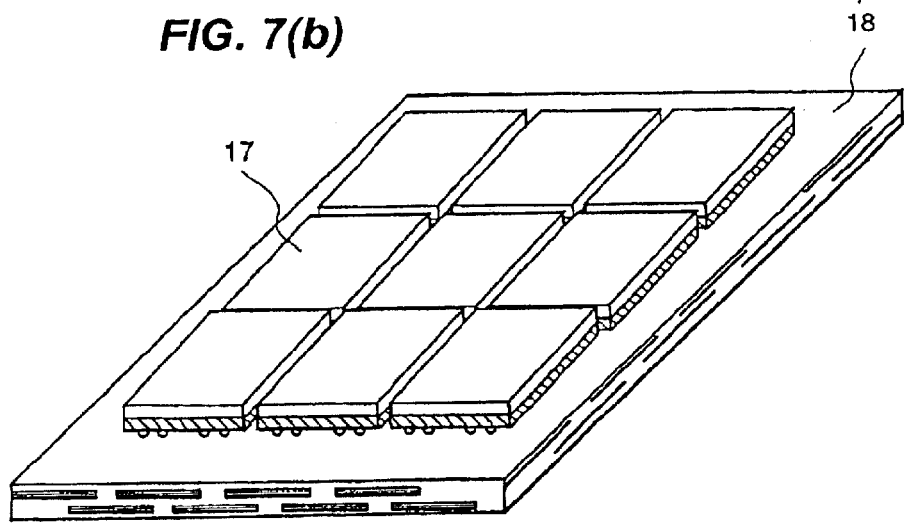

A cross sectional view and a perspective view, respectively, of the semiconductor module of the present invention are indicated in FIGS. 7(a) and (b). The semiconductor module of the present invention was manufactured by the following process.

The semiconductor devices 17 prepared in the embodiment 1 and the embodiment 2 were mounted on designated portions of a built-up mounting substrate having four layered circuits via flux, and the assembly was treated for reflow at 240° C. for 3 seconds.

The semiconductor module of the present embodiment did not generate any failure at the reflow process in a mounting operation. No failure was generated in the temperature cycle test.

COMPARATIVE EXAMPLE 1

Figure 8:
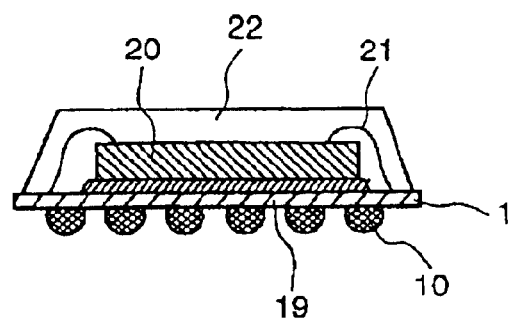
FIG. 8 is a schematic cross section showing an example of a semiconductor device representing a comparative example.

A semiconductor device, as illustrated in FIG. 8, was prepared by the following process and then evaluated.

After forming the circuit layer by the same method as the embodiment 1, the semiconductor chip 20 was adhered to the circuit layer with a die bonding agent 19. Then, the circuit layer was connected electrically to the chip with a gold wire 21 using ultrasonic waves. The connecting portion of the chip and the circuit layer was resin-sealed by a transfer molding method using an epoxy group sealing agent. Finally, the semiconductor device was completed by forming the external terminals.

The semiconductor device was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei CO.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate mm thick. Furthermore, the package area versus chip area was evaluated. The amount of warp of the package was also evaluated. The results are indicated in Table 1.

In case of the present comparative example, the amount of warp of the package was large, because the sealing portion is only on one side of the substrate. Breakage failure occurred in the temperature cycle test, because no stress relaxing layer exists. Reflow failure was generated, because no porous structure for releasing steam exists. The package size becomes larger than the size of the chip, because the chip is connected to the circuit by wire bonding.

COMPARATIVE EXAMPLE 2

Figure 9:
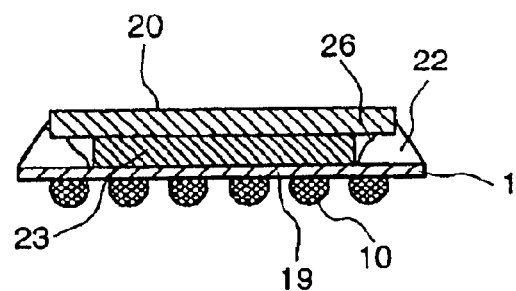
FIG. 9 is a schematic cross section showing an example of a semiconductor device representing a comparative example.

A semiconductor device, as illustrated in FIG. 9, was 20 prepared by the following process and then evaluated.

After forming the circuit layer by the same method as the embodiment 1, a relaxing layer was formed thereon by a printing method using a silicone group rubber. A silicone group adhesive agent was applied onto the relaxing layer 23, and the semiconductor chip was adhered thereto. The reference numeral 26 indicates a gold plated lead. After bonding the chip and the circuit layer using ultrasonic waves, the bonding portion was sealed with a silicone group sealing agent 22. Finally, the semiconductor device was completed by forming the external terminals.

The semiconductor device was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei CO.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

In case of the present comparative example, a breakage failure occurred in the temperature cycle test, because stresses were concentrated to the lead portion connecting the chip and the circuit layer by deformation of the elastomer layer during the temperature cycle test owing to the use of a silicone group material for the stress relaxing layer. Failures, such as chip cracks and other problems, were generated by the dropping test, because no protecting film was provided at the rear plane of the chip. The package size was larger than the size of the chip, because the lead sealing portion was larger than the chip.

COMPARATIVE EXAMPLE 3

Figure 10:
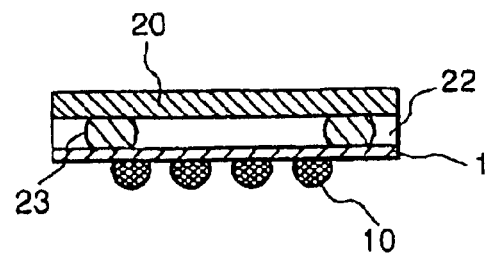
FIG. 10 is a schematic cross section showing an example of a semiconductor device representing a comparative example.
Figure 11A:
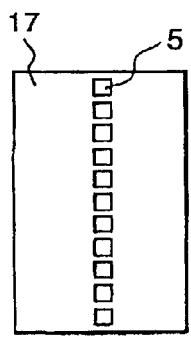
FIGS. 11(a) to 11(c) are diagrams showing the arrangement of electrodes on the semiconductor chip used in the present invention.
Figure 11B:
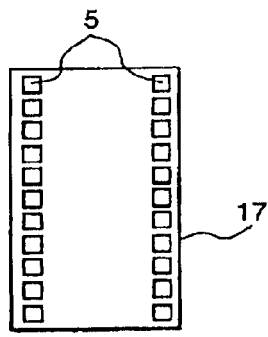
Figure 11C:
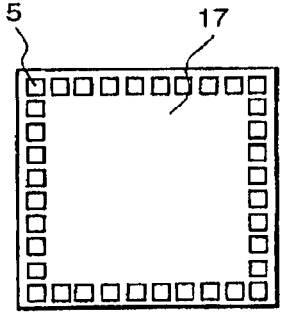

A semiconductor device, as illustrated in FIG. 10, was prepared by the following process, and evaluated.

Plating bumps 24 are formed at the electrode portions 5 of the semiconductor wafer. The position of the semiconductor wafer is adjusted to match the portion of an epoxy group circuit substrate 25 having the same size as the semiconductor wafer, and the semiconductor wafer is connected electrically to the circuit substrate via the plating bumps 24. A liquid epoxy group sealing agent 22 is filled into an interval between the circuit substrate, and the semiconductor wafer, and is then cured. After forming the external electrodes 10 on the circuit substrate 25, the semiconductor device was prepared by dicing the semiconductor wafer.

The semiconductor device was mounted on a mounting substrate, and a temperature cycle test in the range from −55° C. to −125° C. was performed. As the mounting substrate, a copper clad glass cloth base epoxy laminate FR-4 (MC-E-67: made by Hitachi Kasei CO.) was used. Furthermore, a reflow test at 240° C. for 5 seconds was performed after absorbing moisture in an environment at 85° C. and a relative humidity of 85% for 48 hours. An appearance test to detect generation of a chip crack and the like was performed after dropping the semiconductor device at a height of 1 meter onto a glass plate 5 mm thick. Furthermore, the package area versus chip area was evaluated. The amount of warp of the package was also evaluated. The results are indicated in Table 1.

In case of the present comparative example, the amounts of warp of the wafer and the package were large, because the protecting film was not provided onto the rear plane of the chip, and failures, such as chip cracks and other problems, were generated by the dropping test. Breakage failures occurred during the temperature cycle test, because no stress relaxing film was provided. Failures were generated in the reflow operation, because the sealing portion does not have a porous structure for releasing pressure.

In accordance with the semiconductor devices of the present invention, as explained in the previous embodiments, the failure generation rate at 1000 cycles is low in comparison with the semiconductor devices of the comparative examples 1 and 3, because the stress generated in the external terminals is small due to the presence of the stress relaxing layer. Because a porous body is used as a stress relaxing layer, failure during the mounting reflow does not occur. On account of the presence of the protecting film at the rear plane of the semiconductor chip, the amount of warp of the package is small in comparison with the comparative examples 1 and 3. Furthermore, in comparison with the comparative examples 1 and 3, the failure generating rate due to damages, cracks, and the like occurring in the dropping test is small. Any difference in package area relative to the chip area is small in comparison with the comparative examples 1 and 2, because the semiconductor wafer, the stress relaxing layer, and the circuit layer are cut simultaneously along the same plane to form respective units.

The semiconductor device of the present invention comprises a stress relaxing layer between the external terminals and the chip, and an organic protecting film is formed on the rear plane of the chip. Therefore, the amount of warp of the semiconductor device is small, and damage to the edge portions of the chip and cracks are scarcely generated during the dropping test.

The semiconductor device of the present invention comprises the use of porous stress relaxing layer between the external terminals and the chip. Therefore, breakage at the external terminals during the temperature cycle test after mounting scarcely occurs.

Because the stress relaxing layer comprises a three dimensional network structure, steam generated at the time of mounting reflow can be released outside the semiconductor device through the core layer, and swelling and breakage of the substrate, whereon the circuits are formed, are seldom generated during the mounting reflow operation.

In accordance with the manufacturing steps of the semiconductor device of the present invention, the package size is the same as the size of the chip, because the assembling operation can be performed simultaneously for a wafer unit. Therefore, the manufacturing method of the present invention has an advantageous mass producibility.

In accordance with the semiconductor wafer of the present invention, a semiconductor device having a high reliability can be manufactured by mass production. The semiconductor module of the present invention has a high reliability, because the semiconductor device of the present invention is mounted.

What is claimed is:

1. A semiconductor device comprising:
   a semiconductor chip,
   a porous stress relaxing layer provided on a plane, whereon circuits and electrodes are formed, of said semiconductor chip,
   a circuit layer provided on said stress relaxing layer and connected to said electrodes, and
   external terminals provided on said circuit layer, wherein
   an organic protecting film is provided on the plane opposite to said stress relaxing layer of said semiconductor chip,
   said porous stress relaxing layer has a greater porosity than that of the organic protecting film, and
   respective side planes of said stress relaxing layer, said semiconductor chip, and said organic protecting film are exposed to outside of the semiconductor device on a same plane.

2. A semiconductor device comprising:
   a semiconductor chip,
   a porous stress relaxing layer provided on a plane, whereon circuits and electrodes of said semiconductor chip are formed, of said semiconductor chip,
   a circuit layer provided on said stress relaxing layer,
   via-holes provided between the electrodes on said semiconductor chip and said circuit layer,
   conductive portions for connecting electrically said circuit layer and said electrodes in said via-holes,
   external terminals provided at designated portions on said circuits in a grid array pattern, and
   an organic protecting film provided on the plane opposite to the plane where the circuits and electrodes of said semiconductor chip are formed, wherein
   said porous stress relaxing layer has a greater porosity than that of the organic protecting film, and
   respective side planes of said stress relaxing layer, said semiconductor chip, and said organic protecting film are exposed to outside of the semiconductor device on a same plane.

3. A semiconductor device as claimed in claim 1 or 2, wherein
   said organic protecting film has a linear expansion coefficient equivalent to the linear expansion coefficient of said stress relaxing layer.

4. A semiconductor device as claimed in claim 3, wherein said stress relaxing layer is adhered to the semiconductor chip by an adhesion layer, and a linear expansion coefficient of the organic protecting film is substantially equivalent to the linear expansion coefficient of said adhesion layer.

5. A semiconductor device as claimed in claim 2, wherein said stress relaxing layer is composed of porous polytetrafluoroethylene.

6. A semiconductor device as claimed in claim 2, wherein said conductive portion in said via-hole is composed of conductive resin.

7. A semiconductor device comprising:
   a semiconductor chip,
   a porous stress relaxing layer provided on a plane, whereon circuits and electrodes of said semiconductor chip are formed, of said semiconductor chip,
   a circuit layer provided on said stress relaxing layer,
   anisotropic conductive material for connecting electrically said circuit layer and said electrodes on said semiconductor chip,
   external terminals provided at designated portions on said circuits in a grid array pattern, and
   an organic protecting film provided on the plane opposite to the plane, where the circuits and electrodes of said semiconductor chip are formed, wherein
   said porous stress relaxing layer has a greater porosity than that of the organic protecting film, and
   respective side planes of said stress relaxing layer, said semiconductor chip, and said organic protecting film are exposed to outside of said semiconductor device on a same plane.

8. A semiconductor module mounted with plurality of semiconductor devices as claimed in any one of claims 1 to 6 and 7.

9. A semiconductor device as claimed in any one of claims 1, 2 and 7, wherein said side planes of the stress relaxing layer, the semiconductor chip and the organic protecting film respectively form peripheral edges of the stress relaxing layer, the semiconductor chip and the organic protecting film.

10. A semiconductor device as claimed in any one of claims 1, 2 and 7, wherein said stress relaxing layer is adhered to the semiconductor chip by an adhesion layer, and a linear expansion coefficient of the organic protecting film is substantially equivalent to the linear expansion coefficient of said adhesion layer.

11. A semiconductor device as claimed in any one of claims 1, 2 and 7, wherein the organic protecting film is colored black.

12. A semiconductor wafer comprising:
    a chip for forming a semiconductor device, having a plurality of chip areas comprising circuits and electrodes, respectively,
    a porous stress relaxing layer provided on a plane of said chip, whereon the circuits and the electrodes are formed,
    a circuit layer provided on said stress relaxing layer, and connected to said electrodes, and
    external terminals provided on said circuit layer, wherein
    an organic protecting film is provided on the plane opposite to the plane, whereon said porous stress relaxing layer is provided, of said chip,
    said porous stress relaxing layer has a greater porosity than that of the organic protecting film, and
    side planes of the stress relaxing layer are exposed to outside of the semiconductor device.

13. A semiconductor wafer comprising:
    a chip for forming a semiconductor device, having a plurality of chip areas comprising circuits and electrodes, respectively,
    a porous stress relaxing layer provided on a plane of said chip, whereon the circuits and the electrodes of said chip area are formed, a circuit layer provided on said stress relaxing layer, via-holes provided between said electrodes and said circuit layer, conductive portions for electrically connecting said circuit layer and said electrodes in said via-holes, external terminals provided at designated portions on said circuits in a grid array pattern, and an organic protecting film provided on the plane, opposite to the stress relaxing layer, of said chip, wherein said porous stress relaxing layer has a greater porosity than that of the organic protecting film, and wherein side planes of the stress relaxing layer are exposed to outside of the semiconductor device.

14. A semiconductor wafer as claimed in any one of claims 12 and 13, wherein said organic protecting film has a linear expansion coefficient equivalent to the linear expansion coefficient of said stress relaxing layer.

15. A semiconductor wafer as claimed in any one of claims 12 and 13, wherein said stress relaxing layer is composed of porous polytetrafluoroethylene.

16. A semiconductor wafer as claimed in claim 13, wherein said conductive portion in said via-hole is composed of conducive resin.

17. A semiconductor wafer comprising:

a chip for forming a semiconductor device, having a plurality of chip areas comprising circuits and electrodes, respectively, a porous stress relaxing layer provided on a plane of said chip, whereon the circuits and the electrodes of said chip area are formed, a circuit layer provided on said stress relaxing layer, anisotropic conductive material for connecting electrically electrodes on a chip and a circuit layer, external terminals provided at designated portions on said circuits in a grid array pattern, and an organic protecting film provided on the plane opposite to the plane, whereon said circuits and electrodes are formed, of said chip, wherein said porous stress relaxing layer has a greater porosity than that of the organic protecting film, and wherein side planes of the stress relaxing layer are exposed to outside of the semiconductor device.

18. A semiconductor wafer as claimed in any one of claims 12, 13 and 17, wherein said side plane of the stress relaxing layer forms a peripheral edge thereof.

19. A semiconductor device as claimed in any one of claims 1, 2, 7, 12, 13 and 17, wherein the porous stress relaxing layer has a breathing property.

20. A semiconductor device as claimed in any one of claims 1, 2, 7, 12, 13 and 17, wherein said porous stress relaxing layer is made of a material selected from the group consisting of polycarbonate, polyester, polytetrafluoroethylene, polypropylene, polyvinylidene fluoride, cellulose acetate, polysulfone, polyacrylonitrile, polyamide and polyimide.

* * * * *